United States Patent
Alavi et al.

(10) Patent No.: US 9,859,915 B2
(45) Date of Patent: Jan. 2, 2018

(54) RF TUNER WITH BLOCKER DETECTION AND NOISE LIMITED REGION RECOVERY

(71) Applicant: Analog Devices, Inc., Norwood, MA (US)

(72) Inventors: Reza Alavi, Belle Mead, NJ (US); Shobhit Agrawal, Piscataway, NJ (US); Kenneth J Keyes, Jr., Tinton Falls, NJ (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/263,315

(22) Filed: Sep. 12, 2016

(65) Prior Publication Data

US 2017/0077886 A1 Mar. 16, 2017

Related U.S. Application Data (60) Provisional application No. 62/217,525, filed on Sep. 11, 2015.

(51) Int. Cl.
| | | |
|---|---|---|
| H03M 3/00 | (2006.01) | |
| H03M 1/12 | (2006.01) | |
| H04B 7/00 | (2006.01) | |
| H04B 1/10 | (2006.01) | |
| H03G 3/30 | (2006.01) | |
| H03F 3/189 | (2006.01) | |
| H03F 1/52 | (2006.01) | |

(52) U.S. Cl.
CPC ............. *H03M 3/462* (2013.01); *H03F 1/52* (2013.01); *H03F 3/189* (2013.01); *H03G 3/3052* (2013.01); *H03G 3/3068* (2013.01); *H03F 2200/294* (2013.01); *H03F 2200/426* (2013.01); *H03F 2200/451* (2013.01)

(58) Field of Classification Search
CPC ...... H04B 1/0046; H04B 1/10; H04B 1/1027; H04L 25/03006; H04L 25/03057; H03M 1/126; H03M 1/18
USPC ............ 455/234.2, 242.2, 245.2, 278.1, 296; 341/143, 155
See application file for complete search history.

(56) References Cited

U.S. PATENT DOCUMENTS

| | | | |
|---|---|---|---|
| 6,839,389 B2 | 1/2005 | Mehrnia et al. | |
| 8,611,482 B2* | 12/2013 | Zhong | H04L 25/03057 375/233 |
| 8,744,021 B1* | 6/2014 | Gurney | H04B 1/1036 375/316 |
| 9,350,400 B1* | 5/2016 | Landon | H04B 1/1036 |
| 2002/0181568 A1* | 12/2002 | Prater | H04B 1/0007 375/222 |

(Continued)

OTHER PUBLICATIONS

Harris, Jonathan, "What is JESD204 and why should we pay attention to it?" [online], EE Times. [retrieved on Sep. 10, 2016]. Retrieved from the Internet: <URL:http://www.eetimes.com/document.asp?doc_id=129796&print=yes>, (Jul. 31, 2012), 6 pgs.

(Continued)

*Primary Examiner* — Simon Nguyen
(74) *Attorney, Agent, or Firm* — Schwegman Lundberg & Woessner, P.A.

(57) ABSTRACT

A wideband RF tuner with blocker signal detector for detection of blocking signals and for fast recovery from noise limited region.

20 Claims, 5 Drawing Sheets (56) References Cited

U.S. PATENT DOCUMENTS

| | | | |
|---|---|---|---|
| 2008/0181337 A1* | 7/2008 | Maxim | H03M 1/0614 375/340 |
| 2008/0225174 A1* | 9/2008 | Greggain | H04N 5/46 348/572 |
| 2009/0207311 A1* | 8/2009 | Fu | H03G 3/001 348/678 |
| 2010/0056201 A1* | 3/2010 | Akamine | H04B 1/0017 455/552.1 |
| 2010/0172450 A1* | 7/2010 | Komaili | H04L 27/3809 375/345 |
| 2011/0261912 A1* | 10/2011 | Li | H03G 3/3078 375/350 |
| 2012/0129480 A1* | 5/2012 | Ruelke | H04B 1/0021 455/296 |
| 2013/0260707 A1* | 10/2013 | Li | H04B 1/0035 455/266 |
| 2014/0270019 A1* | 9/2014 | Ly-Gagnon | H03D 1/04 375/346 |

OTHER PUBLICATIONS

Inkol, R., et al., "Digital Quadrature Demodulation for Radar ESM Applications". *Defence Research Establishment Ottawa Technical Note 92-10*, (May 1992), 60 pgs.

Toh, Y., "Broadband I/Q Modulator Eases Radio Design", *Analog Dialogue*, vol. 41, (Nov. 2007), 1 pg.

Ziomek, C., et al., "Digitai I/Q Demodulator.", *Proceedings of the 1995 Particle Accelerator Conference.* vol. 4., (1996), 2663-2665.

* cited by examiner

RF TUNER WITH BLOCKER DETECTION AND NOISE LIMITED REGION RECOVERY

PRIORITY APPLICATIONS

This application claims the benefit of priority to U.S. provisional Application Ser. No. 62/217,525, filed Sep. 11, 2015, the content of which is incorporated herein by reference in its entirety.

BACKGROUND

A wideband tuner is capable of detecting composite signals from multiple sources such as terrestrial base stations and satellites. A typical wideband tuner includes analog and digital subsections. Often, the analog subsection can respond to signals much wider than the signaling frequency bandwidth. Signals that are not in a signaling frequency band of interest but in the adjacent frequency bands can act as blocker signals that block signals of interest. These blocker signals can appear randomly or periodically with a varying duty cycles. The amplitude level of these signals relative to a desired signal of interest may vary significantly.

Wideband tuners may employ automatic gain control (AGC) circuitry in order to regulate the received signal strength. For example, if a received signal strength is weak the AGC circuit boosts the receiver gain to minimize the front-end noise and boost the signal level (attack mechanism). Conversely, if the received signal strength is strong, the AGC circuit attenuates front-end receiver gain stages to avoid signal clipping and operation of the receiver in a non-linear region. A wideband tuner operates based on a fast attack/slow decay mechanism for responding to changing signal conditions.

A fast attack/slow decay approach present in the a AGC circuit may not be fast enough to respond quickly to the appearance and disappearance of these blocker signals. Moreover, a strong incoming blocker signal can drive the tuner into its non-linear region of operation in which it cannot receive a signal of interest. Furthermore, a strong blocker can reduce the tuner gain into its noise limited region.

DESCRIPTION OF EMBODIMENTS

A wideband RF tuner includes blocker signal detection circuitry to detect blocker signals and includes recovery circuitry to achieve rapid recovery from a noise limited region operation. The blocker detection circuitry and recovery circuitry operate in concert with overload signal detection circuitry that protects against overload signal levels. A strong out-of-band blocker signal can result in the blocker circuitry causing the tuner to lower its gain in order to avoid operating in its non-linear region. However, when the blocker signal disappears, the tuner may be operating in its noise limited region relative to certain desired signals. The recovery circuitry acts to cause the tuner to recover quickly from operation in the tuner noise limited region.

Figure 1:
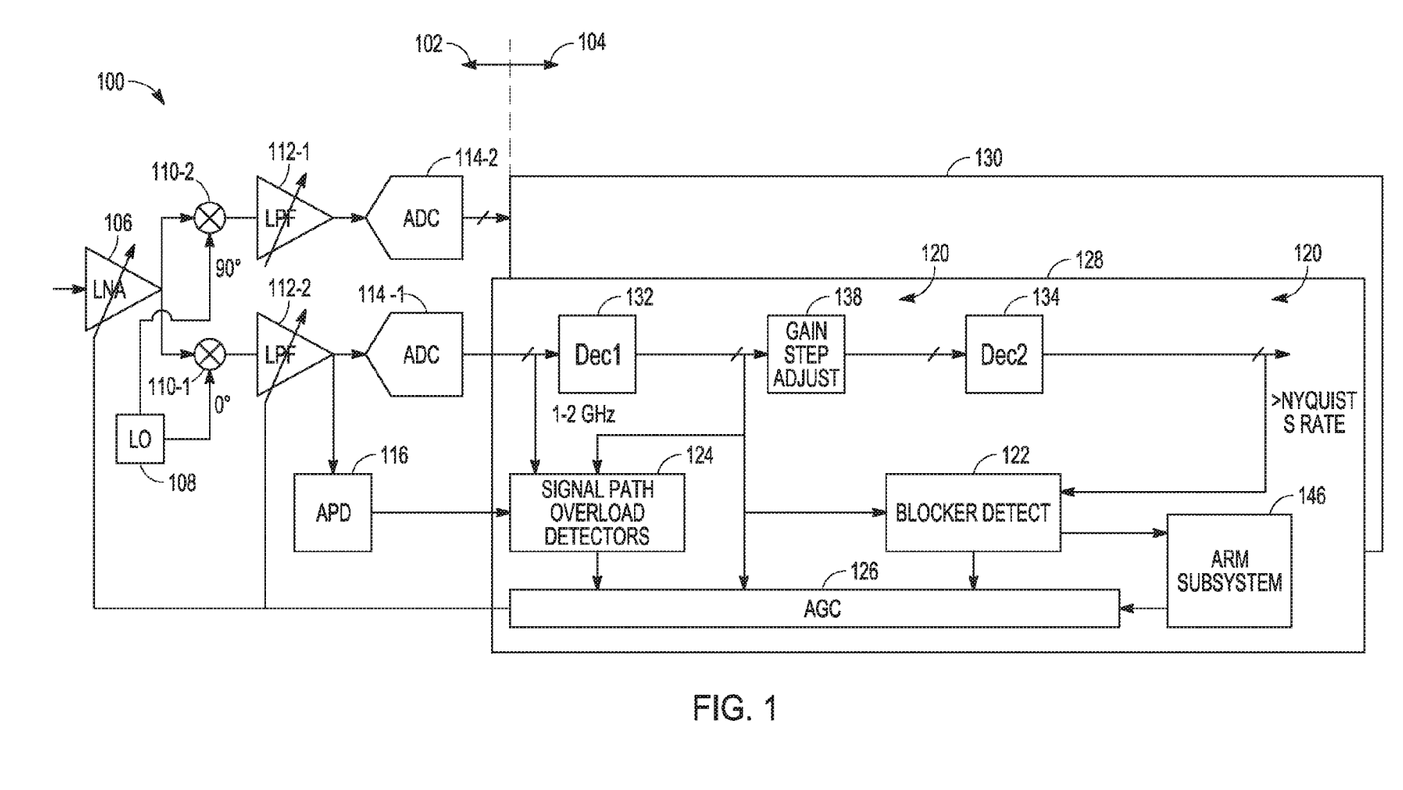
FIG. 1 is an illustrative system diagram of an RF tuner circuit.

FIG. 1 is an illustrative system diagram of an RF tuner 100 in accordance with some embodiments. The RF tuner 100 can receive several satellite and terrestrial signals multiplexed in a signaling bandwidth. The signaling bandwidth can be 25 MHz, and the RF frequency can be anywhere within a 2 GHz band, for example. The RF tuner includes an analog IQ circuit block 102 and a digital IQ circuit block 104.

Analog Circuit Block

The analog IQ circuit block 102 converts a received RF signal to intermediate frequency (IF) I-channel (in-phase) and Q-channel (Quadrature) signals. The analog IQ circuit block 102 includes a low noise amplifier (LNA) 106 that receives and amplifies an RF signal. A local oscillator (LO) 108 produces local oscillator (LO) signals that have a 90-degree phase shift between them. A first mixer circuit 110-1 mixes a 0-degree phase shifted (In-phase) LO signal with the RF signal. A second mixer circuit 110-2 mixes a 90-degree phase shifted (Quadrature) LO signal with the RF signal. First and second low pass filters (LPFs) 112-1, 112-2 filter the I and Q signals to remove high frequency mixing products and to provide filtered analogue I-channel and Q-channel signals. First and second analog to digital converters (ADCs) 114-1, 114-2 convert the filtered analog I-channel and Q-channel signals into digital I-channel and Q-channel signals. Analog peak detector (APD) 116 circuitry detects peak analog signal levels at the output of the first LNA 112-1.

Digital Circuit Block

The digital IQ circuit block 104 includes two decimation pipelines 120 (only one shown) that digitally down-convert the frequency of the I-channel and Q-channel signals. A blocker detect circuit 122 rapidly detects occurrences and disappearances of blocker signals. An overload detector circuit 124 detects overload signal levels. An automatic gain control (AGC) circuit 126 provides feedback signals to the analog circuit block 102 to control gain imparted by the LNA 106 and the first and second LPFs 112-1, 112-2 based upon occurrences and disappearances of blocker signals and based upon detection of overload signal levels. A processor system, which includes one or more central processing units (CPUs) and associated program and data storage devices, is coupled to receive signals from the block detector 122 and to provide signals to the AGC 126.

Digital Decimation

The digital IQ circuit block 104 includes a digital I-block 128 and a digital Q-block 130. The digital I-block 128 includes a digital I-channel signal decimation pipeline 120. The digital Q-block 130 includes a digital Q-channel signal decimation pipeline (not shown). The digital I-channel and digital Q-channel decimation pipelines are identical. To simplify the description, only the digital channel decimation path is described. It will be appreciated that the digital Q-channel decimation path is substantially the same.

Referring to the I-channel signal decimation pipeline 120, a first decimator stage 132 located at the start of the pipeline 120 decimates the I-channel signal from a first sampling rate, 2,000 MSPS (i.e. 2000 MHz) for example, to a second sampling rate, 250 MSPS. A second decimator stage 134 located farther down the pipeline 120 decimates the I-channel signal from the second sampling rate, 250 MSPS, to a third sampling rate, 50 MSPS, for example. The pipeline 120 includes a digital gain adjust circuit 138 operatively coupled between the first and second decimator stages 132, 134 to impart gain to the I-channel signal.

AGC Circuitry

The digital IQ circuit block includes AGC circuitry 126, overload detectors 124 and blocker detect circuitry 122, which are substantially identically coupled to both the digital I-channel and digital Q-channel decimation pipelines. To simplify the description, the operation of the AGC circuitry 122, overload detectors 124, and blocker detect circuitry 126 are described only with respect to the digital I-channel decimation path. It will be appreciated that their operation with respect to the digital Q-channel decimation path is substantially the same.

The AGC circuitry 126 measures power in the digital I-channel signal and in the digital Q-channel signal and provides AGC feedback control signals to adjust gain imparted by the LNA 106 and to the first and second LPFs 112-1, 112-2 in response to the power measurements. In some embodiments, the AGC power measurements are based upon a received signal strength (RSSI) measurement and the AGC feedback control signal causes gain adjustment of the digital I-channel signal in programmable increments. Generally, the gain adjustments are small so as to avoid disturbing operation of components in the analog block whose operation can be perturbed by sharp changes in gain. The AGC circuit 126 takes power measurements at a location along the pipeline between the first decimator 132 and the gain step adjust circuit 138, which is near the start of the pipeline, during programmable AGC measurement time windows. In some embodiments, each AGC measurement time window is approximately several 100 microseconds in duration, for example.

Overload Detector Circuitry

The overload detector circuit 4 provides protection against sudden overload signals that threaten to overload the circuitry within the digital IQ circuit block 104. For example, an overload signal may arise at the first decimator stage 132 during a time interval that is shorter than the AGC measurement time window. The overload signal may occur quickly, much faster than the AGC RSSI measurement response time, for example, and the AGC 126 itself may not be able to react promptly respond to the overload. Thus, in response to receipt of an indication of an occurrence of a sudden overload signal, the overload detector circuit 124 provides a signal to the AGC circuit 126 to cause it to provide an AGC feedback signal to reduce gain imparted by the analog block 102.

Figure 2:
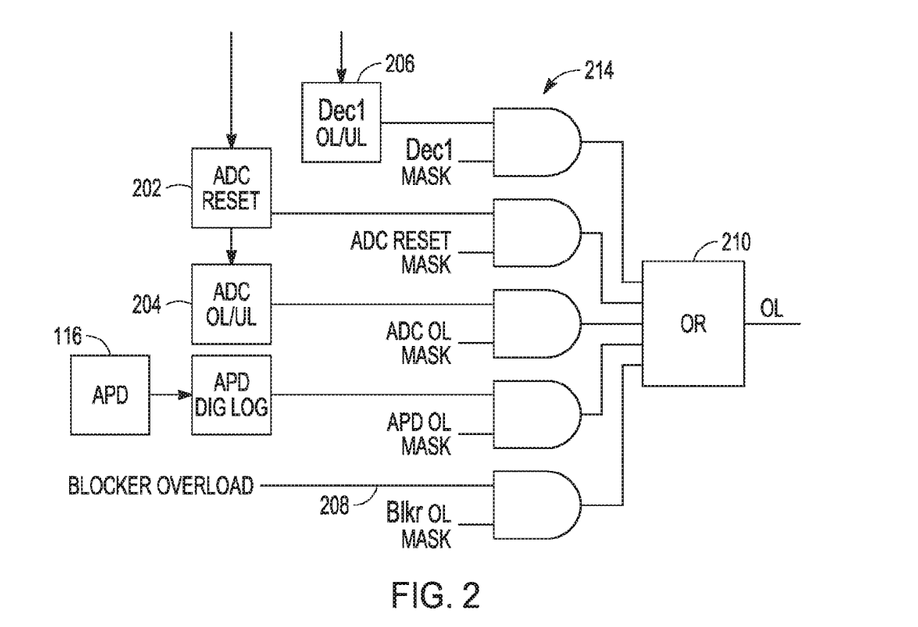
FIG. 2 is an illustrative schematic diagram representing certain details of the AGC circuit and the overload detector.

FIG. 2 is an illustrative schematic diagram representing certain details of the AGC circuit 126 and of the overload detector circuit 124 in accordance with some embodiments. The overload detector 124 includes multiple individual overload detectors. A first overload detector includes the analog peak detector (APD) 116. A second overload detector includes an ADC reset detector 202, since ADC reset may occur as a result of an overload condition. A third overload detector includes an ADC overload detector 204, which detects oscillation of the first ADC output and to provide a second overload signal in response to detecting oscillation. In some embodiments, the first ADC includes a sigma-delta ADC, and oscillation of the ADC provides an indication that the ADC is close to becoming overloaded. A fourth overload detector includes a first decimator stage overload detector 206 coupled to monitor a signal level at the output of the first decimator stage 132. A fourth overload detector includes a blocker overload detector, described more fully below, that provides on line 208 an indication of blocker overload signals. The AGC circuit 126 includes a logical OR circuit 210 coupled to receive the overload signals provided by the first through fifth load detectors. A digital logic interface 212 is provided between the APD 116 and the logical OR circuit 210. In response to any one of the overload detectors indicating an overload, the AGC circuit 126 provides an AGC feedback signal to cause reduction of the gain imparted by the LNA 106 and the first and second LPFs 112-1, 112-2.

The overload detectors may generate a single or multiple overload signals simultaneously or within a short time interval of one another. These overload signals go through a logically "OR" function and create a single overload indicator signal for presentation to the AGC block. Prior to the logical "OR" operation, each overload signal can be individually masked off. Respective OR logic gates 214 are associated with each respective overload detector signal line so that the AGC unit may mask or respond to an overload event based on a programmable mask bit. The AGC block in responding to the overload signal shall quickly reduce the tuner in setting. The amount of gain change based on an overload indicator is programmable. Furthermore, upon an overload epoch, the AGC unit shall not respond to successive overload indicators within a time-out interval. This avoids AGC responding to simultaneous or multiple overloads signals generated by the same event out of multiple overload detector units.

Blocker Detection Circuitry

Figure 3:
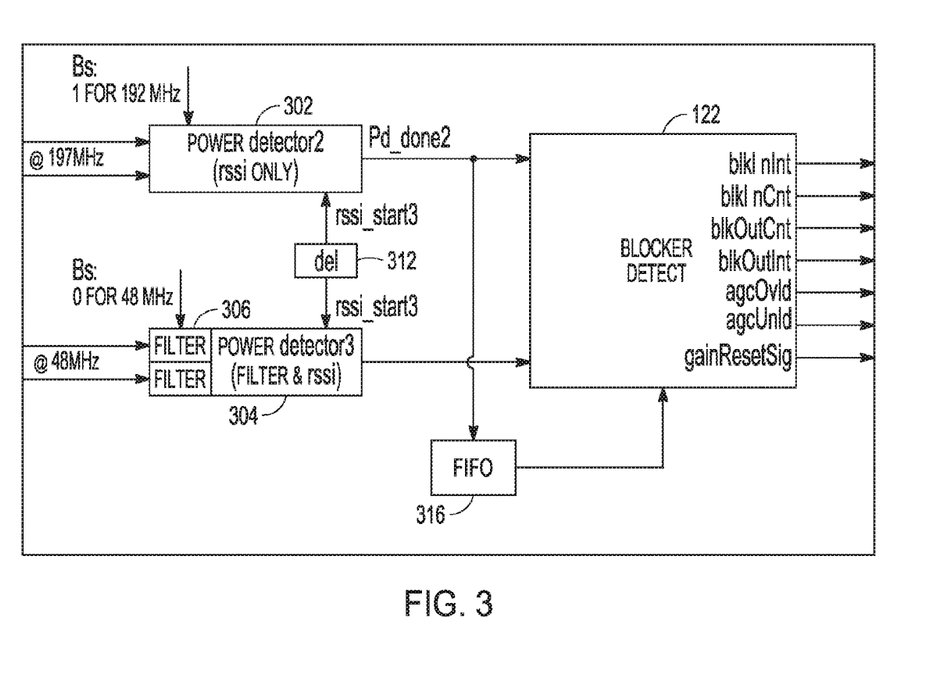
FIG. 3 is an illustrative schematic diagram representing certain details of a blocker detector and power measurement circuits.

FIG. 3 is an illustrative schematic diagram representing certain details of blocker detector 122 and certain power measurement circuits 302, 304 in accordance with some embodiments. A first power detector 302 is coupled to detect an input signal power level near a start of the pipeline 102, where the I-channel signal has the second sampling rate, 250 MSPS, for example. A second power detector 304 is coupled to detect an in-band signal power level near an end of the pipeline 102, where the I-channel signal has the third sampling rate, 50 MSPS, for example. The second power detector 304 includes low pass filters 306 to filter out quantization noise, for example. The first and second power detectors 302, 304 provide their power measurements to the blocker detector circuitry 122, which is described more fully below. The first power detector 302 also is coupled to provide its sequence of power measurements to a first FIFO circuit 316, which itself is coupled to provide its stored power measurements sequence to the blocker detector 122. The blocker detector 122 is configured to provide information signals and control signals to a processor system 146.

The first and second power detectors 302 each measures RSSI power of the I-channel signal during blocker detect time windows that are shorter than the AGC measurement time window. In some embodiments, the blocker detect time window is 6 microseconds in duration, for example. A delay circuit 312 delays start of a power measurement by the second power detector 304 so as to align the I-channel signal segment within the first and second power detectors 302, 304. More particularly, the delay circuit 312 delays power measurement by the second power detector 304 for a delay time interval sufficient for the I-channel signal segment, whose power is measured by the first power detector 302, to propagate down the pipeline 120 from the first power detector 302 to the second power detector 304. The second power detector 304 measures RSSI power of the I-channel signal during a delayed blocker detect time window.

Figure 4:
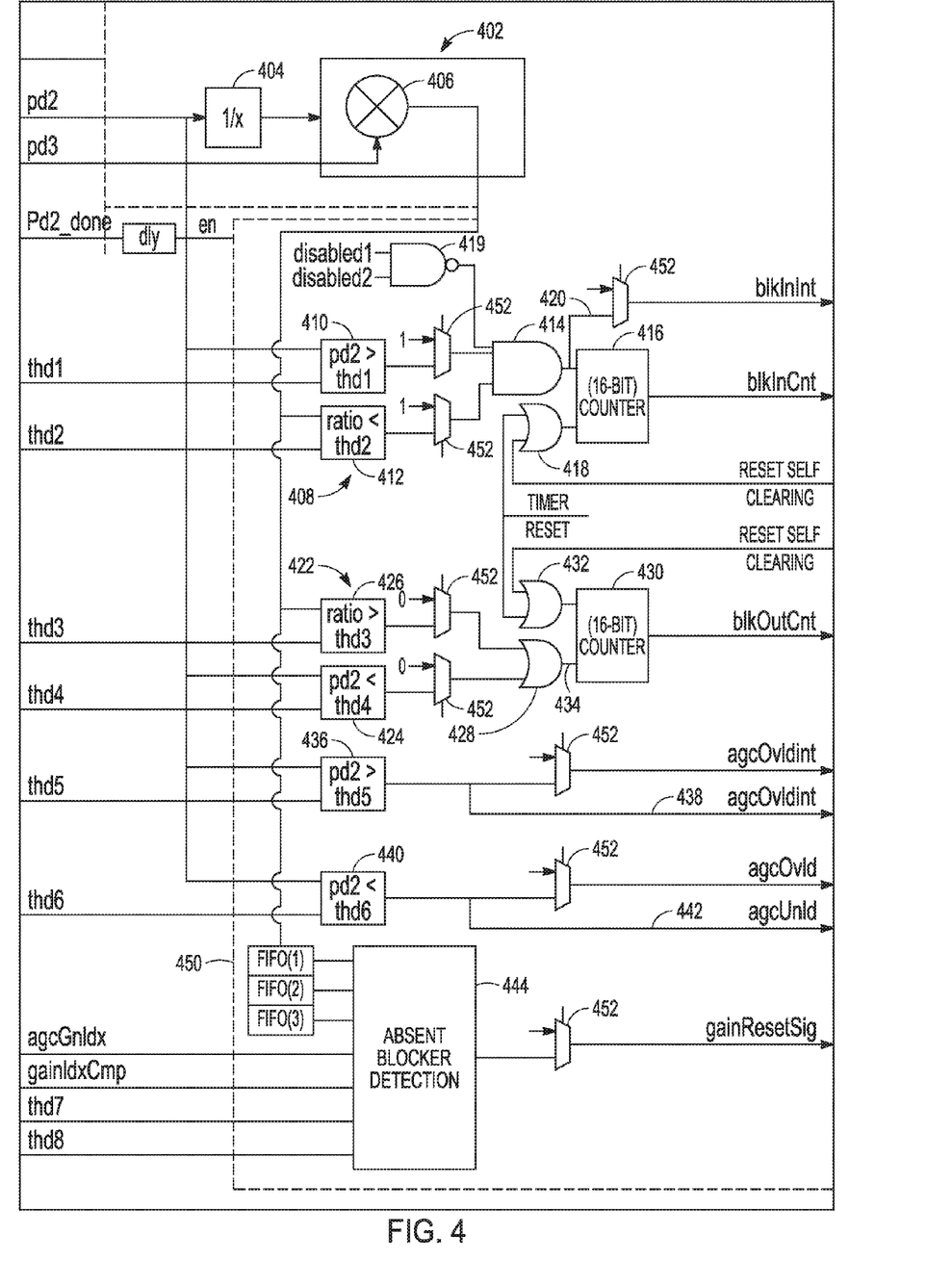
FIG. 4 is an illustrative schematic diagram showing certain details of a blocker circuit.

FIG. 4 is an illustrative schematic diagram showing certain details of the blocker detector 122 to FIG. 1 in accordance with some embodiments. The blocker detector 122 includes a ratio determination circuit 402 coupled to receive the sequence of power measurement values pd2 and pd3 produced by the first and second power detectors 302, 304, respectively. The power level pd2 indicates power level of a higher frequency input signal (e.g., 250 MSPS) on the pipeline 120. The power level pd3 indicates power level of a lower frequency in-band signal (e.g., 50 MSPS) on the pipeline 120. The ratio determination circuit 402 includes a reciprocal value determination circuit 404 that determines a value 1/pd2 for each successive pd2 value and a multiplier circuit 406 to compute a corresponding sequence of pd3/pd2 ratio values (the "ratios") in response to the sequence of power measurement values pd2 and pd3.

It will be appreciated that a power level pd2 measurement of the second higher sample rate signal will include power measurement for frequencies that are not included in power level pd3 measurement of the third lower sample rate signal. For example, the presence of a blocker at a frequency that is within a frequency range of the second higher sample rate signal but is outside a frequency range of the of the third lower sample rate signal can influence the power level pd2 measurement more than it influences the power level pd3 measurement. Thus, the pd3/pd2 ratio value provides an indication of whether or not blockers are present that are outside the frequency of the third lower sample rate signal.

The blocker detector 122 includes a present blocker counter circuit 408 that is coupled to produce a count indicative of a time interval during which a blocker is present based upon the sequence of pd2 values and corresponding ratios. The present blocker counter circuit 408 includes first and second comparators 410, 412, a first AND logic circuit 414, a first counter 416, and a first XOR logic circuit 418, and a NAND logic circuit 419, coupled as shown. The first comparator 410 receives the sequence of pd2 value and a programmable first threshold value thd1. The first comparator 410 is configured to produce a discreet logic one value in response to each occurrence of a pd2 sequence value greater than the thd1 value. The second comparator 412 receives a corresponding sequence of ratios and a second programmable threshold value thd2. The second comparator 412 is configured to produce a discreet logic one value in response to each occurrence of a ratio less than the thd2 value. The first AND logic circuit 414 is coupled to receive logic values produced by the first and second comparators 410, 412 and in response to each occurrence of a pair of comparator output signals that indicate both that pd2>thd1 and ratio<thd2, to provide on a first control line 420, a discreet blocker present increment signal indicative of presence of a blocker. The first control line 420 is coupled to provide the blocker present signal to the processor 122. The present blocker increment signal acts as a first interrupt control signal to the processor 146. The first counter 410 is configured to increment a count in response to each discreet occurrence of the present blocker increment signal. The first counter 416 is couple to provide a first blocker present count signal to the processor 146. The first XOR logic circuit 418 is coupled to receive a timer signal and a reset signal from the processor 146. The NAND logic circuit 419 acts as a disable circuit to controllably disable the present blocker counter circuit 408.

The blocker detector 122 includes an absent blocker counter circuit 422 that is coupled to produce a count indicative of a time interval during which a blocker is absent based upon the sequence of pd2 values and corresponding ratios. The absent blocker counter circuit 422 includes third and fourth comparators 424, 426, a second AND logic circuit 428, a second counter 430, and a second XOR logic circuit 432, coupled as shown. The third comparator 424 receives the sequence of pd2 values and a programmable fourth threshold value thd4. The third comparator 424 is configured to produce a discreet logic one value in response to each occurrence of a pd2 sequence value less than the thd4 value. The fourth comparator 426 receives the corresponding sequence of ratio values and a third programmable threshold value thd3. The fourth comparator 426 is configured to produce a discreet logic one value in response to each occurrence of a ratio value greater than the thd3 value. The second AND logic circuit 428 is coupled to receive logic values produced by the third and fourth comparators 424, 426 and in response to each occurrence of a pair of comparator output signals that indicate both that pd2<thd4 and ratio>thd3, to provide on a second control line 434, a discreet absent blocker increment signal indicative of absence of a blocker. The second counter 430 is configured to increment a count in response to each discreet occurrence of the second blocker present increment signal. The second counter 430 is couple to provide a second blocker absent count signal to the processor. The second XOR logic circuit 432 is coupled to receive a timer signal and a reset signal from the processor.

A fifth comparator 436 receives the sequence of pd2 values and a programmable fifth threshold value thd5. The fifth comparator 436 is configured to provide a third control signal to the AGC circuit 126 on a third control line 438 in response to each occurrence of a pd2 sequence value greater than the thd5 value. A sixth comparator 440 receives the sequence of pd2 values and a programmable sixth threshold value thd6. The sixth comparator 440 is configured to provide a control signal to the AGC circuit 126 on a fourth control line 442 in response to each occurrence of a pd2 sequence value less than the thd6 value.

The blocker detector 122 also includes an absent blocker detector 444 and a second FIFO circuit 450 which includes a first FIFO1 stage, a second FIFO2 stage and a third FIFO3 stage, which are described more fully below. Disable multiplexer circuits 452 are coupled to permit controllable disable of components of the present blocker detector 122.

The processor 146 can use information provided by the blocker detector 122 to evaluate the impact of blockers upon receiver performance and can provide signals to the AGC circuit 126 to adjust the AGC in range to more effectively react to the blockers.

It will be appreciated that the blocker detection circuitry ascertains the presence or the absence of a blocker signal by measuring the power ratio of the in-band to the total received power. The input signal and the in-band power detectors act as RMS power detectors both having the same programmable power measurement interval. The input signal power detector operates at a sampling frequency much higher than the required signaling sampling rate. This allows measuring the input signal power to $\pm Fs/2$, a frequency range extended beyond the signaling bandwidth. In addition, the analog front-end band-select filter(s), filter the out-of-band signal above a given frequency that is below Fs/2 relative to carrier center frequency. As result, blocking signals in the range above signaling bandwidth but below the analog front-end band-select filters affect the tuners operations.

For example, for a RF signaling BW of 25 MHZ, a sampling rate of 192 MHz, ensures power measurement $\pm 96$ MHz in the digital front-end. Also suppose the front-end analog filters band limits the input signal to $\pm 60$ MHz relative to carrier frequency for a direct conversion receiver, then out-of-band signals in the range of 12.5 MHz to 60 MHz may alter the tuners operations.

For certain ADCs, a low pass filter may be added at the output of the ADC to limit the ADC quantization noise in order to allow the AGC to operate in its full dynamic range. The cutoff frequency of this filter has to be equal or above the analog band-limits filter frequency, or 60 MHz for the above example.

In general, the in-band power detectors operate at signaling sampling frequency or a sampling frequency close but above a minimum signaling sampling frequency. As a result, further filtering of the in-band signal only to the frequency of interests may be employed as shown in FIG. 3. As explained above, the signal pipeline filtering on the receive path along with the in-band filters delay the received samples at the in-band power detector. Thus, the start of this power detector is delayed to align the power measurement of the in-band to total signal power. This assures both power detectors operate on the same segments of input received signals.

Upon measuring the in-band and total input signal power, a metric is formed by computing the ratio of the in-band power to the total received power. Other forms of metrics derived from the same measurements may also be used for comparison purposes. The power ratio metric is compared against a programmable threshold to ascertain the existence of a blocker. However, the in-band power to total received signal power ratio standalone may not be a sufficient metric for the blocker detection in some instances; the relative level of the in-band and the total received powers also play a role in deciding the existence of a blocker. This can be illustrated by considering two different cases. First, consider for example, the wideband tuner is only receiving the satellite signals with total power level at about −95 dBm and a blocker signal arrives at −75 dBm. The power ratio detector shall detect the presence of a blocker, however, the AGC does not need to respond to this type of blocker, since this blocker does not need to change the AGC gain index. In the second case, for example, a desired signal is being received at about −50 dBm and a blocker signal arrives at −30 dBm, for the same difference of 20 dB, however, the AGC needs to respond to this condition. Thus, the ratio detector is augmented via a threshold detector in declaring the state of a blocker.

The same power ratio metric can also be used to ascertain the absence of a blocker. That is if there is not a blocker signal, the power ratio metrics will be close to unity as both of the power detectors measure the same input signal power. In the same way as above, the power detector metric standalone may also not be a sufficient a metric to declare absence of a blocker. That is when both the desired signal and the blocker powers are sufficiently small to affect the AGC operations, even though the power ratio detector indicates existence of a blocker. The design for declaring an absence of a blocker signal is explained with reference to FIG. 4.

Both the in-band and the power detector measurement units in the blocker detection unit operates independent from the AGC RSSI detector their RSSI duration interval is also set independently. As a result, by setting the blocker RSSI measurement interval to a small duration, this unit can quickly ascertain the existence or absence of blockers over very short intervals, and turned them into statistics over a longer time interval set by the blocker timer units. These statistics maybe analyzed either by the BBIC or the ARM processor subsystem to further modify the operation of the AGC unit. For instance, if these blockers occur with frequent frequency and power, one can lower the maximum AGC gain setting of the system to avoid frequent overloads of the system or minimize the duration of the overloads. Furthermore, the short duration total power detectors can be checked against a threshold to check if ADC input signal level is above threshold or overloaded, or below a threshold or under loaded. These indicator signals are passed to the AGC unit to change the system gain accordingly if not masked by the AGC unit.

Noise-Limited Region Recovery

Figure 5:
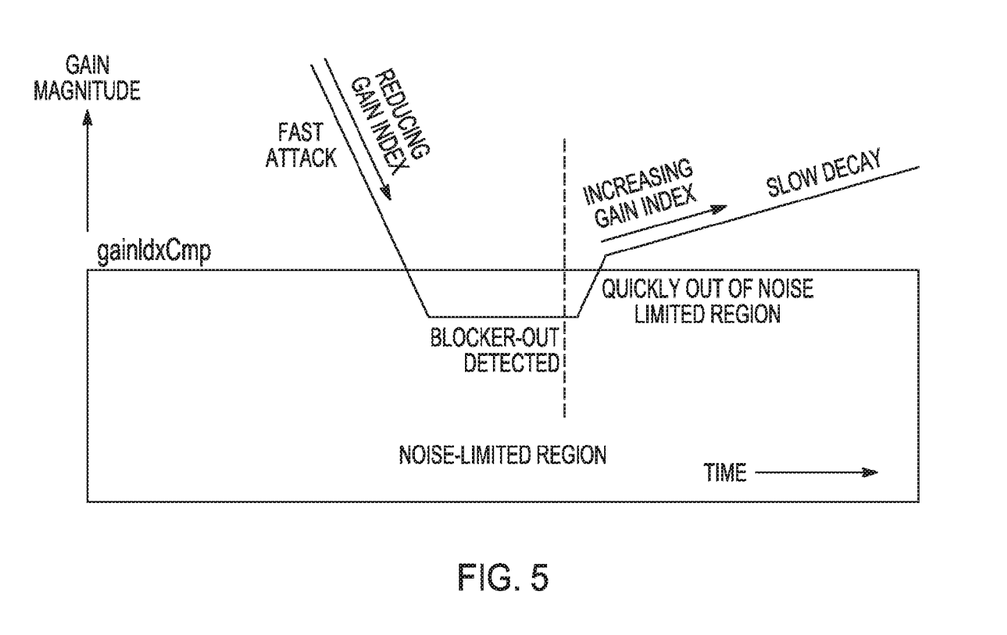
FIG. 5 is an illustrative curve representing transition of a gain value into and out of a noise limited operation region.

FIG. 5 is an illustrative curve representing transition of a gain value into and out of a noise limited operation region in accordance with some embodiments. Blocker signals may appear and disappear on a periodic basis, and are referred to as pulse blockers. When blocker signals are strong, the overload and AGC routines quickly decrease and may drive the tuner gain setting to its minimum or a gain setting very close to it. When the AGC gain is reduced below a specific gain index, then the desired wideband tuner will not be able to detect certain source signals transmitted within the bandwidth because the receiver is operating in a noise limited region relative to those signals as represented in FIG. 5 in which time is measured relative to a horizontal axis, and tuner gain is measured relative to a vertical axis.

Referring to FIG. 5, a falling fast attack portion of the curve represents the AGC causing a rapid decrease in tuner gain in response to a blocker signal. It can be seen that the tuner gain is reduced to a value within a noise limited region in which the tuner cannot reliably detect a signal of interest. The horizontal portion of the curve represents the tuner operating at a gain within the noise limited region while the blocker is present. The vertical dashed line represents disappearance of the blocker. The rising increasing gain index portion of the curve represents an increasing gain following disappearance of the blocker. It will be appreciated, as explained more fully below, that the disappearance of the blocker is detected quickly and that the rising curve portion starts at a time soon after disappearance of the blocker.

The AGC operations mode for the tuner follows a fast attack/slow decay rule. With slow decay approach, increasing the AGC gain setting, when a blocker disappears, will be set by the decay interval. It is expected that the decay interval be on the order of 1 millisecond. As a result, when the tuner operates in its noise limited region, signal recovery will take a long time to be able to demodulate satellite signals or even terrestrial signals operating near its minimum system SNR.

Blocker-Out Detection

Figure 6:
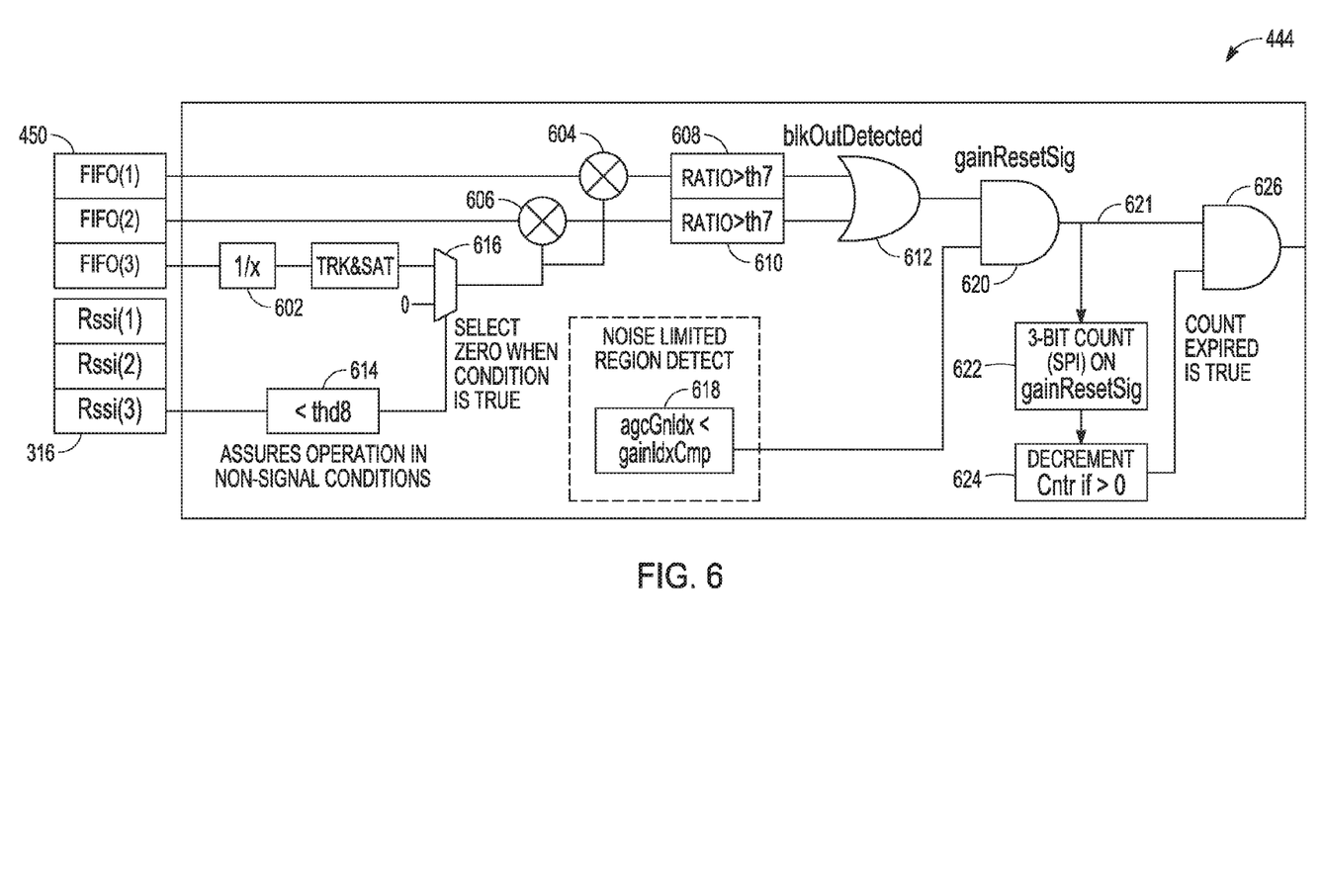
FIG. 6 is an illustrative drawing representing an absent blocker detection circuit.

FIG. 6 is an illustrative drawing representing an absent blocker detector 444 in accordance with some embodiments. The absent blocker provides an indication of (1) a recent gone blocker (2) while the tuner is in a noise limited region. The disappearance of the blocker indicates that gain can be increased without risk of interference from the blocker, which has disappeared. The tuner's operation in the noise limited region indicates that larger gain steps than during normal operation may be used to rapidly recover from the limited gain region since the tuner may be incapable of properly receiving desired signals while in the noise limited region.

The first FIFO circuit 316 includes a first Rssi(1) stage, a second Rssi(2) stage and a third Rssi(3) stage that are configured to receive a sequence of pd2 Rssi power measurement values as explained above with reference to FIG. 3. The second FIFO circuit 450 includes a first FIFO1 stage, a second FIFO2 stage and a third FIFO3 stage that are configured to receive a sequence of ratio values as explained above with reference to FIG. 4.

Assume, for example, that the second FIFO 316 sequentially receives first, second and third ratio values. Upon receipt of the third ratio value, the first received ratio value will be saved in the third FIFO3 stage; the second received ratio value will be saved in the second FIFO2 stage; and the third received ratio value will be saved in the first FIFO1 stage. A reciprocal determination circuit 602 determines a reciprocal of a value currently stored in the third FIFO3 stage. A second multiplier circuit 604 multiples a ratio value saved in the first FIFO1 stage by the reciprocal of the ratio value saved in the third FIFO3 stage to produce a first absent blocker determination value. A third multiplier circuit 606 multiples a ratio value saved in the second FIFO2 stage by the reciprocal of the ratio value saved in the third FIFO3 stage to produce a second absent blocker determination value.

In parallel in time with the second FIFO 450 receiving a sequence of ratio values, the first FIFO 316 receives a corresponding sequence of pd2 power measurement values. In particular, assume that first FIFO 316 sequentially receives first, second and third ratio values. Upon receipt of the third pd2 power measurement value, the first received pd2 power measurement value will be saved in the third Rssi(3) stage. It will be appreciated that the first received pd2 power measurement value stored in the third Rssi(3) stage corresponds to the first received ratio saved in the third FIFO3 stage.

A seventh comparator 608 determines whether the first absent blocker determination value is greater than a seventh programmable threshold value thd7. An eighth comparator 610 determines whether the second absent blocker determination value is greater than the seventh programmable threshold value thd7. An OR logic circuit 612 provides an absent blocker signal value to indicate an absent blocker in response to the seventh comparator 608 indicating that the first absent blocker determination value is greater than thd7 or the eighth comparator 610 indicating that the second absent blocker determination value is greater than thd7.

It will be appreciated that in the absence of a blocker, the ratio pd3/pd2 is approximately one (pd3/pd2=1) and that when a blocker is present the ratio pd3/pd2 is much less than one (pd3/pd2<<1). Consequently, if FIFO3 stores a ratio that represents a blocker present and FIFO2 stores a ratio that represents blocker absent, then the product of the reciprocal of the ratio stored in FIFO3 and the ratio stored in FIFO2 will be a value larger than one (1). The same is true for if FIFO3 stores a ratio that represents a blocker present and FIFO1 saves a ratio that represents blocker absent; the product of the saved ratios is larger than one (1).

At least two comparator circuits, the seventh and the eighth comparators 608, 610, and three FIFOs are employed to provide additional resolution for identifying a blocker gone condition, to protect against a false positive absent blocker determination. In order to prevent such disappearance from skewing or corrupting results, a sequence of at least three ratios are saved i.e. in the three FIFOs. For example, a blocker that has gone may straddle two blocker detect time windows such that a pd2 power measurement is slightly above a threshold for one blocker detect time window and a pd2 power measurement is slightly above a threshold for an adjacent blocker detect time window. Thus, evaluation of a sequence of at least three pd2 power measurements ensures detection of a blocker gone condition even if the blocker straddles blocker detect time windows.

It is noted that if each of the three FIFOs stores a ratio indicative of an absent blocker, then the product values will be approximately one (1) i. e. Thus, the OR circuit 612 produces an absent blocker in response to the FIFO3 storing a ratio indicating a present blocker, but not in response to the FIFO3 storing a ratio indicating an absent blocker.

False positive protection is provided to protect against a false positive absent blocker determination arising due to a FIFO reset. A multiplex circuit 616 is configured to select for input to the second and third multiplier circuits 604, 606, one of a reciprocal of the ratio value saved in the third FIFO3 stage or a value zero (0). A ninth comparator circuit 614 is configured to control the selection by the multiplexer 616. Specifically, the ninth comparator 614 is configured to compare a pd2 power measurement value stored in the third Rssi stage with an eighth threshold value thd8. In response to the pd2 power measurement value stored in the third Rssi stage having a value greater than thd8, the ninth comparator 614 provides a signal to cause the multiplex circuit 616 to select the reciprocal value for provision to the second and third multiplier circuits 604, 606. In response to the pd2 power measurement value stored in the third Rssi stage having a value less than thd8, the ninth comparator 614 provides a signal to cause the multiplex circuit 616 to select the zero (0) value for provision to the second and third multiplier circuits 604, 606. It will be appreciated that, typically, upon FIFO reset, the stages of the first and second FIFOs 316, 450 will contain value zero (0) values. Thus, the ninth comparator 614 detects the occurrence of a reset. Since in response to detecting a reset, a zero (0) value is provided to each of the multipliers 604, 606, the seventh and eighth comparators 608, 610 will not indicate an occurrence of a recently disappeared blocker. Hence, a false positive due to a FIFO reset is avoided.

A tenth comparator circuit 618 provides a noise limited signal value indicative of whether a present AGC gain is within a noise limited in region. The tenth comparator 618 compares a present gain value with a noise limited region in threshold value. The tenth comparator 618 provides a gain level signal value indicative of whether the present gain value is less than the noise limited region in threshold value.

A third AND logic circuit 620 receives the absent blocker signal value provided by the OR logic circuit 612 and receives the gain level signal value provided by the tenth comparator circuit 618. The third AND logic gate provides a gain reset signal to the processor 146 indicative of whether the absent blocker signal value indicates the absence of a blocker while the gain level signal value indicates that the present gain is in the noise limited region.

The absent blocker detector 444 includes protection against provision of multiple blocker gone signals if multiple blockers disappear in quick succession. The 3-bit count circuit 622 stores a count value and is configured to provide the count value to the decrement circuit 624 in response to a signal on line 621 that indicates an occurrence of a recently gone blocker. In response to receiving the count, the decrement circuit 624 counts down from the count value during a count time interval and provides a signal indicating the end of the count. An AND logic circuit is coupled to receive the signal on line 621 and to receive the end of the count signal and to permit passage of a signal on line 621 while the end of the count signal is provided. The count and decrement circuits 622,624 act to prevent successive provisions of blocker gone signal if two blockers disappear within a count time interval.

It will be appreciated that the basis for detecting a blocker transition either from appearing or disappearing is in-band to the total RSSI power ratio metric. However, not only its current value, but also its prior values may be used to detect a transition. As a result, the power ratios are buffered in FIFO order, as shown in FIG. 4 and FIG. 6, to ascertain the blocker-out transition. The following illustrate the process for the blocker-out detection unit.

When a blocker is present, the power ratio will be considerably less than unity and will finally reside at the last location in the FIFO unit. Once the blocker vanishes, the power metric will become close to unity. A comparison of this ratio with its power ratio when the blocker was present is the metric for the detecting a blocker-out transition condition. But, a blocker may leave in the midst of a current measurement and skew the result for this measurement. As a result, a FIFO length of three samples are used for a proper operation a blocker-out transition.

As explained above, the ratio of these in-band power to input power is used as a metric for determining the blocker-out transition, although other forms of metric from these power measurements maybe derived and compared as well. Also, there exists a mechanism to avoid a false detection. A false detection occurs when there is no input signal, or after a reset of the FIFO. Under these conditions the value in last FIFO location will be very small or zero. Computing its reciprocal and multiplying by the other values in the FIFO, for the purpose of detecting a blocker-out transition will result in a false detection of blocker-out transition. As a result, here, two approaches are provided against a false blocker-out transition detection.

In the first approach, a comparison of the power detector ratio against a pre-determined threshold maybe used to disable the blocker-out transition detection. That is if this ratio is very small or zero, then this process is stopped. Alternatively, the RSSI value at the third location in the total power detector FIFO maybe compared against a threshold. When this value exceeds the threshold, the blocker-out detection process is enabled. Otherwise, it is disabled.

Noise Limited Detection and Operation

For the wideband tuner, under design, detection of noise-limited region may be achieved by comparing the AGC gain index against a programmable but pre-defined gain index. If the AGC gain index is below this gain index threshold, then the wideband tuner operates in its noise-limited region. The actual value of this gain index will be determined during the characterization of the device, but will be known in advance, and a recovery from a noise-limited region thus requires detecting the following two conditions:

1. Detection of a blocker-out condition
2. Detection of operating the wideband tuner in its noise limited region Once the above conditions are detected, two procedures may be used to applicable to quickly recover from the noise-limited region of the tuner. The first approach entails speeding up the AGC gain change whilst operating in its decay operation mode. The speedup operation can be accomplished by defining a speedup decay interval which the AGC utilizes when the above conditions are detected. Once the AGC gain exceeds the gain setting threshold representing the noise-limited region of the tuner operation, the decay operation mode of the AGC reverts back to its normal decay operation mode. This technique may still use multiple short-decay RSSI measurement intervals to increase the AGC gain setting.

In the second approach, detection of the above conditions follows overwriting the AGC gain index to a value above the gain index threshold. For example, the ARM processor may overwrite the AGC gain index to a non-noise-limited region.

In another embodiment, the host processor may overwrite a recovery from the noise-limited region. That is a recovery from noise-limited region may be ultimately under the host processor control. The host processor may exercise this control either via an API command or via an allocation of a dedicated pin form the host processor to the tuner. Should the recovery from noise-limited region be enabled, the FIFO structure of the blocker-out detection unit, may result in two consecutive detections of a blocker-out condition. However, this condition can be avoided if either the FIFO is reset or the total power detector FIFO is reset, depending on the method used in avoiding the false alarm condition in the blocker-out detection unit.

The foregoing description and drawings is presented to enable any person skilled in the art to create and use an RF tuner with blocker detection and recovery from operation in a noise limited region. Various modifications to the embodiments will be readily apparent to those skilled in the art, and the generic principles defined herein may be applied to other embodiments and applications without departing from the spirit and scope of the invention. Numerous details are set forth for the purpose of explanation. However, one of ordinary skill in the art will realize that the invention might be practiced without the use of these specific details. In other instances, well-known processes are shown in block diagram form in order not to obscure the description of the invention with unnecessary detail. Identical reference numerals may be used to represent different views of the same or similar item in different drawings. Flow diagrams in drawings referenced are used to represent processes. Therefore, it will be understood that various modifications can be made to the embodiments by those skilled in the art without departing from the spirit and scope of the invention, which is defined in the appended claims.

The invention claimed is:

1. A wideband radio frequency (RF) tuner for detecting at least one desired RF signal and tuning out at least one undesired blocker signal, the tuner comprising:
   a first decimator that decimates a signal to a first sampling rate;
   a second decimator that decimates the signal to a second sampling rate that is less than the first sampling rate;
   a first power detector that determines a power of a segment of the signal at the first sampling rate;
   a second power detector that determines a power of the segment of the signal at the second sampling rate;
   a blocker detector circuit including first and second comparators, wherein:
      the first comparator compares the determined power of the segment at the first sampling rate to a first threshold and provides a first comparison value; and
      the second comparator compares a ratio of the determined power of the segment at the first sampling rate and the determined power of the segment at the second sampling rate to a second threshold and provides a second comparison value; and
   a logic circuit configured to provide a blocker present signal for adjusting a gain in the tuner based at least in part upon the first and second comparison values.

2. The tuner of claim 1, further including:
   a comparator to compare a present gain value with a noise limited region gain threshold value.

3. The tuner of claim 1, comprising:
   a ratio circuit to produce a sequence of individual ratios based upon one or more of the determined individual powers at the first sampling rate and one or more of the determined individual powers at the second sampling rate.

4. The tuner of claim 3, comprising:
a FIFO circuit including first, second and third FIFO stages, in which the third FIFO stage is the deepest of the three FIFO stages, configured to sequentially receive individual ratios of a sequence of ratios of powers at the first and second sampling rates.

5. The tuner of claim 4, comprising:
an absent blocker circuit that includes at least one comparator to provide a signal indicative of an absent blocker in response to the third FIFO stage storing a ratio indicative of a present blocker and at least one of the first and second FIFO stages storing a ratio indicative of an absent blocker.

6. The tuner of claim 3, comprising a First In First Out (FIFO) circuit to receive and store at least one of a determined power or a determined ratio.

7. The tuner of claim 3, wherein the logic circuit is configured to provide the blocker present signal for adjusting a gain in the tuner based at least in part upon the individual ratios.

8. The tuner of claim 1, comprising a delay circuit to synchronize a detected power at the first sampling rate with a detected power at the second sampling rate.

9. The tuner of claim 1, comprising an automatic gain control (AGC) circuit to adjust the gain in the tuner, wherein gain adjustment based on the blocker present signal is inhibited during a time period when the tuner gain is less than a specified noise-limited gain threshold value.

10. The tuner of claim 9, wherein the AGC circuit is configured to increase a gain more rapidly for a period of time upon exiting a noise-limited region than for a subsequent period of time in which the AGC circuit has remained outside of the noise-limited region.

11. The tuner of claim 1, comprising:
an analog IQ circuit block that converts an RF signal to an I-channel signal and a Q-channel signal; and
a digital IQ circuit block comprising:
the first and second decimators;
the blocker detector circuit that detects at least one of a presence or absence of at least one blocker signal;
the power detector circuit that provides respective power measurements at the first and second decimated frequencies to the blocker detector circuit; and
an automatic gain control circuit that provides a feedback signal to the analog IQ circuit block to control the gain of the respective I-channel and Q-channel signals based on whether the blocker signal is present.

12. The tuner of claim 11, comprising:
a processor circuit that receives a signal from the blocker detector circuit and provides a gain control signal to the automatic gain control circuit.

13. The tuner of claim 1, in which the blocker detector circuit comprises:
a counter circuit configured to produce a count indicative of a time interval during which a blocker is present.

14. The tuner of claim 1, further comprising:
an absent blocker detector circuit configured to determine the absence of a blocker signal at least in part using a power ratio of in-band power to total received power.

15. The tuner of claim 1, further comprising:
an absent blocker counter circuit configured to produce a count indicative of a time interval during which a blocker is absent.

16. The tuner of claim 15, wherein the absent blocker counter circuit is configured to produce a count indicative of a time interval during which a blocker has been absent since a most recent blocker has been present.

17. A wideband RF signal detection method for detecting at least one desired RF signal and tuning out at least one undesired blocker signal, the method comprising:
receiving an input RF signal and decimating the input RF signal to different first and second decimated signals at corresponding first and second sampling rates, wherein the second sampling rate is lower than the first sampling rate;
detecting a power of the first and second decimated signals at the corresponding first and second sampling rates;
determining whether the blocker signal is present, the determining including comparing a first indication including the detected power at the first sampling rate with a second indication including the detected power at the second sampling rate; and
when the blocker signal is determined to be present, temporarily decreasing a receiver gain to attenuate the blocker signal then increasing the receiver gain with the blocker signal being attenuated.

18. The method of claim 17, comprising adjusting the receiver gain in the tuner, wherein such gain adjustment based on the blocker present signal is inhibited during a time period when the tuner gain is less than a specified noise-limited gain threshold value.

19. The method of claim 17, comprising increasing the receiver more rapidly for a period of time upon exiting a noise-limited region than for a subsequent period of time in which the AGC circuit has remained outside of the noise-limited region.

20. A wideband radio frequency (RF) tuner comprising:
an analog IQ circuit block that converts an RF signal to an I-channel signal and a Q-channel signal; and
a digital IQ circuit block comprising:
first and second decimators that respectively downconvert the frequency of the I-channel signal and the Q-channel signal to first and second decimated frequencies;
a blocker detector circuit that detects at least one of a presence or absence of at least one blocker signal;
a power measurement circuit that provides respective power measurements at the first and second decimated frequencies to the blocker detector circuit;
an automatic gain control circuit that provides a feedback signal to the analog IQ circuit block to control the gain of the respective I-channel and Q-channel signals based on whether the blocker signal is present; and
a processor circuit that receives a signal from the blocker detector circuit and provides a gain control signal to the automatic gain control circuit.

* * * * *

UNITED STATES PATENT AND TRADEMARK OFFICE
CERTIFICATE OF CORRECTION

PATENT NO. : 9,859,915 B2
APPLICATION NO. : 15/263315
DATED : January 2, 2018
INVENTOR(S) : Alavi et al.

Page 1 of 1

It is certified that error appears in the above-identified patent and that said Letters Patent is hereby corrected as shown below:

In the Claims

In Column 13, Line 39, in Claim 11, delete "1-channel" and insert --I-channel-- therefor Signed and Sealed this
Twenty-eighth Day of May, 2019

Andrei Iancu
*Director of the United States Patent and Trademark Office*